United States Patent [19]

Rossell

[11] 4,010,386
[45] Mar. 1, 1977

[54] SYNCHRONOUS SWITCH CONTROL CIRCUIT

[75] Inventor: Allen J. Rossell, Detroit, Mich.

[73] Assignee: Burroughs Corporation, Detroit, Mich.

[22] Filed: Jan. 20, 1976

[21] Appl. No.: 650,629

[52] U.S. Cl. .................... 307/252 UA; 307/235 E; 307/215

[51] Int. Cl.² ........................................ H03K 17/00

[58] Field of Search ....... 307/252 UA, 252 W, 240, 307/264, 235 E; 323/25

[56] References Cited

UNITED STATES PATENTS

| | | | |
|---|---|---|---|
| 3,881,118 | 4/1975 | Forrest et al. | 307/252 UA |
| 3,925,688 | 12/1975 | Kalfus | 307/252 UA |
| 3,950,657 | 4/1976 | Sheng et al. | 307/252 UA |

Primary Examiner—Stanley D. Miller, Jr.
Assistant Examiner—B. P. Davis
Attorney, Agent, or Firm—Dale V. Gaudier; Manuel Quiogue; Kevin R. Peterson

[57] ABSTRACT

A switching circuit for controlling the selective electrical energization of a resistive or inductive load by an AC power source such that a switching operation is performed only when the current from the AC power source is nearly zero. Pulses synchronous with the zero crossings of the AC power source are used to trigger one-shots to effectuate appropriately gated delay pulses when the switching circuit is ON and OFF, respectively. A latching circuit connected to an ON-OFF switch activates and deactivates the switching circuit.

17 Claims, 1 Drawing Figure

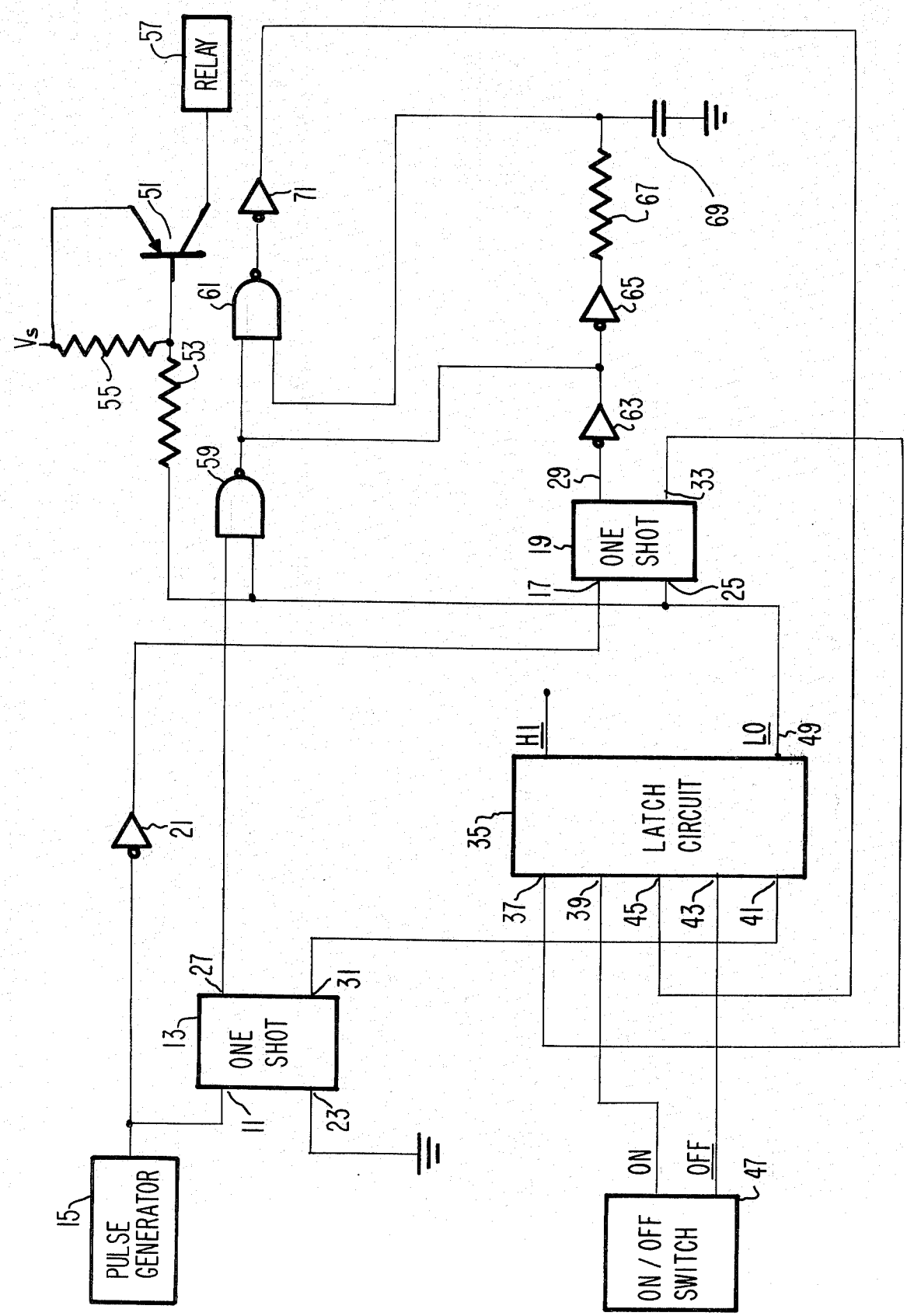

SYNCHRONOUS SWITCH CONTROL CIRCUIT

BACKGROUND OF THE INVENTION

This invention relates to a switching circuit for controlling the transfer of power from an AC source to a resistive or inductive load.

Conventional switches for selectively transferring power from an AC source to a load generally connect and disconnect the power as soon as the switch is actuated into an ON or OFF condition. The load is therefore generally connected or disconnected abruptly; and the alternating nature of the power source may create extreme voltage and current surges upon switching which may have deleterious effects upon the load. Moreover, such transient surges generally cause undesirable noise and interference in the load circuitry.

Such results as surges, noise and interference are particularly undesirable when the load includes reactive elements. For example, in a power supply for digital logic circuits, such surges, noise and interference could easily destroy the logic elements.

SUMMARY OF THE INVENTION

It is therefore an object of the present invention to precisely control the flow of electrical power between an AC source and a load.

A further object of this invention is to provide a control circuit for precisely timing the turn-on and turn-off of AC power to a load at a time when the current from the AC source is close to zero.

Another object of the invention is to provide a switching circuit which is responsive to the zero-crossings of an AC power source to effectuate appropriate delays before energizing a load with an AC power source.

Still another object of the invention is to provide a novel circuit which is responsive to an ON/OFF switch for controlling the transfer of power from an AC power source to a load such that when the ON condition is initiated, the transfer begins only after a predetermined delay subsequent to the occurrence of a positive-going zero-crossing of the voltage from the AC power source.

A further object of the invention is to provide a switching circuit responsive to an ON/OFF switch for terminating the flow of power from an AC source to a load only after a predetermined delay subsequent to the first negative-going zero-crossing of the voltage of the AC source occurring after the OFF condition is actuated.

Still another object of the switching circuit of the present invention is to prevent transient power surges, noise and interference when an inductive load is selectively energized and de-energized by an AC power source.

These and other objects of the present invention are accomplished by a pair of timed delay circuits which are actuated by the positive-going zero-crossings and negative-going zero-crossings, respectively, of an AC power source, such as ordinary line voltage, which is to be coupled to a load. A clocked latching circuit has as its inputs the outputs from the delay circuits and also the outputs from an ON/OFF switch. The output of the latching circuit is applied to a switching transistor which activates an appropriate relay to energize or de-energize the load with the AC power source. Specifically, when an ON condition is initiated, the latching circuit will change its output state after a predetermined delay which begins after a positive-going zero-crossing in the AC power source. Similarly, an OFF condition causes the latching circuit to again change its output state after a predetermined delay which begins after a negative-going zero-crossing in the AC power source. Pulses which are synchronized to the zero-crossings of the AC power are provided as the inputs to the delay circuits.

BRIEF DESCRIPTION OF THE DRAWING

Other objects, features and advantages of this invention will be readily apparent and clearly understood by reference to the following detailed description when read in conjunction with the accompanying drawing wherein:

FIG. 1 is a schematic diagram of the switching circuit of the present invention.

DETAILED DESCRIPTION OF THE PREFERRED EMBODIMENT

A train of rectangular pulses are applied at the positive trigger input 11 of a first timed one-shot 13 from a pulse generator 15 which generates pulses which are synchronous with the AC power source (not shown) which the circuit of the present invention selectively connects and disconnects from a given load. The pulses from the pulse generator 15 have transition points which are synchronous with the zero-crossings of the AC power source. Specifically, the pulses from the pulse generator 15 have positive-going leading edges when positive-going zero-crossings occur in the AC source; and the pulses have negative-going trailing edges when negative-going zero-crossings occur in the AC source. For example, an optical-coupler or a isolator connected to the AC power source may be used to trigger a voltage comparator for generating the synchronous pulses. The pulses from the pulse generator 15 are also coupled to the positive trigger 17 of a second timed one-shot 19 through an input inverter 21. Thus, it can be seen that the first timed one-shot 13 is triggered by the leading edge of a pulse from the pulse generator 15, which leading edge coincides with a positive-going zero-crossing of the AC power source; and the second timed one-shot 19 is triggered by the trailing edge of a pulse from the pulse generator 15 which is inverted by the input inverter 21, which trailing edge coincides with a negative-going zero crossing of the AC power source. The negative inputs 23 and 25 of the timed one-shots 13 and 19 are connected to accept reference establishing voltages. Outputs responsive to the triggering of timed one-shots 13 and 19 are obtained at triggered output terminals 27 and 29, respectively. Non-triggered outputs (i.e., the stable outputs) from the one-shots 13 and 19 are obtained at non-triggered outputs 31 and 33, respectively.

A clocked latching circuit 35 is provided for accepting a plurality of high output generating input signals at terminals 37 and 39, and a plurality of low output generating input signals at terminals 41 and 43. The outputs of the latching circuit 35 change state upon the application of a clock pulse to clocking terminal 45 if the inputs which caused the prior latching circuit output have changed together. That is, the latching circuit 35 will change state if one of the high signal level inputs to one set of inputs (either high or low output generating) changes to a low level and the other set of inputs both change to a high level. High output generating inputs 37 and 39 accept signals from the non-triggered output 33 of the second timed one-shot 19 and from the ON terminal of an ON/OFF switch 47, respectively. Low output generating inputs 41 and 43 accept signals from the non-triggered output 31 of the first timed one-shot 13 and from the OFF terminal of the ON/OFF switch 47, respectively. The low output terminal 49 (LO) of the latching circuit 35, which generates a low level output when both high-output generating inputs 37 and 39 receive high level signals and at least one of the low output generating inputs 41 ad 43 receives a low level signal during a clock pulse applied to the clocking terminal 45, is connected to the negative input 25 of the second timed one-shot 19 and the base of a switching transistor 51 through an input resistor 53. The HI terminal of the latching circuit 35, which generates a high level signal to indicate a high output state, is not used. The base of the transistor 51 is biased through a biasing resistor 55 which is connected to a voltage source $V_s$. The emitter of the transistor 51 is connected to the voltage source $V_s$ and the collector of the transistor 51 generates an output signal to activate a relay 57. Since the switching transistor 51 is a PNP transistor, a low signal at the low output terminal 49 of the latching circuit 35 turns on the transistor 51 to activate the relay 57; and a high level signal at the terminal 49 turns off the transistor 51 and thereby deactivates the relay 57.

The triggered output 27 of the first timed one-shot 13 is connected to one input of a dual input NAND gate 59 which has as its other input the signal from the low output terminal 49 of the latching circuit 35. The output of the NAND gate 59 is applied to the first input of another NAND gate 61. The triggered output 29 of the second time one-shot 19 is connected through an inverter 63 to the first input of the NAND gate 61. The second input of the NAND gate 61 accepts signals from an inverting RC network which includes an inverter 65 which accepts the output of the inverter 63, a resistor 67 connected between the output of the inverter 65 and the second input of the NAND gate 61, and a capacitor 69 which is connected between ground and the second input of the NAND gate 61. The output of the NAND gate 61 is applied to an inverter 71 which has its output connected to the clocking terminal 45.

The operation of the circuit will now be described in greater detail. Initially, the latching circuit 35 is in a low output state when the ON/OFF switch 47 is in the OFF condition, which means that a high level signal exists at the low output terminal 49 of the latching circuit 35 and the transistor 51 is off. When the ON/OFF switch 47 is placed in the ON condition a high level signal is applied to the high output generating terminal 39 and a low level signal is applied to the low output generating terminal 43. However, the latching circuit 35 will not change to a high output state (which causes a low level signal to be present at the low output terminal 49) until a high level signal exists at the other high output generating terminal 37 and a low level signal exists at the low output generating terminal 41 during the occurrence of a clock pulse applied to the clocking terminal 45. Because of the gating circuitry connected to the output of the first one-shot 13, a clock pulse will not appear at the clocking terminal 45 until after the timed output of the first one-shot 13, which, as previously discussed, is triggered by a positive-going pulse from the pulse generator 15. The sequence of pulses through the NAND gates 59 and 61 and the inverter 71 is as follows. While the one-shot 13 is on, and assuming that the output of the latching circuit 35 is low, the output of the NAND gate 59 is low. This causes a high output from the NAND gate 61 which is inverted by the inverter 71. Thus, a low output from the inverter 71 is applied to the clocking terminal 45. When the one-shot 13 times out, the output of the NAND gate 59 attains a high signal level. The other input to the NAND gate 61 at this time is also a high signal level because the second one-shot 19 is not in a triggered state and a double inversion is performed by the inverters 63 and 65. At this point, it is necessary to point out that the timed outputs of both one-shots 13 ad 19 are chosen to be less than one pulse width of the output of the pulse generator 15. Furthermore, the capacitor 69, which is necessary to create clock pulses once the complete system has activated the relay 57, is sufficiently small to charge and discharge in a time period well within the timed output of the one-shot 13. Thus, the output of the NAND gate 61 goes low when the one-shot 13 times out and the clocking terminal 45 receives a high level signal from the inverter 71. The latching circuit 35 then generates a high output and a low level signal occurs at the low output generating terminal 49 which is applied to an input of the NAND gate 59 and to the base of the transistor 51 through the input resistor 53. The transistor 51 is turned on and activates the relay 57 for connecting the AC power supply to the desired load. In summary, the latching circuit 35 attains a high state after the one-shot 13 times out.

Once the system attains an "on" state as described above, the output of the NAND gate 59 has a high signal level. The circuit elements used in this particular embodiment operate such that when two signals are applied to a junction such as the connection between the outputs of the NAND gate 59 and the inverter 63, the low level signal dominates. That is, the junction attains a low signal level. Thus, as long as the system is on, the output of the inverter 63 determines one of the inputs to the NAND gate 61.

At this point, it is important to note that the signal present at the low output terminal 49 of the latching circuit 35 determines whether the one-shot 19 can be positively triggered by pulse applied to its triggering input 17. If a high level signal is present at the negative input 25, indicating that the system is "off", the one-shot 19 cannot be triggered. When a low level signal is present at the negative input 25, indicating that the system is on, the one-shot 19 is capable of being triggered by positive going pulses applied at the positive input 17 of the one-shot 19. Thus, it is apparent that the one-shot 19 generates timed signals upon triggering only after the switching control circuit of the present invention is on.

At the subsequent negative-going pulse from the pulse generator 15, the timed one-shot 19 is triggered through the input inverter 21 and generates a high level signal at the output 29. This signal is inverted by the inverter 63 which causes the NAND gate 61 to generate a high level output, thereby changing the signal at the clocking terminal to a low level through the inverter 71. When the one-shot 19 times out, a high level signal is applied to one input of the NAND gate 61 and a high level output from the low output terminal 33 is applied to the high out generating input terminal 37 of the latching circuit 35. Since the output of the inverter 65 is connected via the resistor 67 to the grounded capacitor 69, the second input to the NAND remains at a high level until the capacitor 69 loses its charge through the resistor 67 which has its opposite end held at a low level by the output of the inverter 65. This means that the NAND gate 61 generates a low level signal until the junction between the resistor 67 and the capacitor 69 reaches a low level, at which time the NAND gate 61 returns to a high level output. Thus, a positive clock pulse is applied from the inverter 71 to the clocking input terminal 45 subsequent to the timing out of the one-shot 19. As previously explained, the triggered outputs of the one-shots 13 and 19 are for durations which are less than the pulse width generated by the pulse generator 15. Therefore, it is clear that at the time of the clock pulse subsequent to the timing out of the one-shot 19, the low output generating inputs 41 and 43 of the latching circuit 35 have high and low level signals, respectively, from the low output 31 of the one-shot 13 and from the OFF terminal of the ON-/OFF switch 47. And since the one-shot 19 has timed out, both inputs to the high output generating inputs 37 and 39 are at a high level. Because of these input conditions, the latching circuit 35 will not change state and will remain in the high state with a low level signal continuing to be outputted at the low output terminal 49. As previously discussed, this low output level from the low output terminal 49 of the latching circuit 35 effecftively blocks out the triggered output 27 of the one-shot 13 from the remainder of the circuit by virtue of the NAND gate 59 which will generate a high level output as long as one of its inputs remains low. Thus, once the latching circuit 35 has been set to the high output state and the ON/OFF switch 47 outputs do ont change, the only clock pulses applied to the clocking terminal 45 are those subsequent to the timing out of the one-shot 19, which have been previously shown to have no effect on the output state of the latching circuit 35.

However, when the ON/OFF switch 47 is placed in the OFF condition, the ON and OFF outputs apply a low level signal and a high level signal to the inputs 39 and 43, respectively, of the latching circuit 35. Thus, at the occurrence of the clock pulse subsequent the initiation of an OFF condition, the low output 33 of the one-shot 19 applies a high level signal to the input terminal 37 since the one-shot 19 has timed out; and the low output 31 of the one-shot 13 applies a high level signal to the input 41 of the latching circuit because the timed output of the one-shot 19 is well within the pulse width generated by the pulse generator 15. The result is that the latching circuit 35 will change state with this particular clock pulse since both inputs 41 and 43 have high level signals applied and at least one of the inputs 37 and 39 has a low level signal applied. Therefore, it is readily apparent that the transistor 51 is turned off by the latching circuit 35 after a predetermined delay established by the one-shot 19 which delay starts after the first negative-going zero-crossing of the AC power supply which triggers the timed one-shot 19.

In summary, the described structure activates the relay 57 after a predetermined delay subsequent the first occurrence of a positive-going zero-crossing in the AC power supply after the ON condition is initiated; and it deactivates the relay after a predetermined delay subsequent the first occurrence of a negative-going zero-crossing in the AC power supply after the OFF condition is initiated.

From the foregoing it can be seen that the respective turn-on and turn-off delays of the timed one-shots 13 and 19 subsequent positive going and negative-going zero-crossings are predetermined for desired current flow characteristics at turn-on and turn-off. These characteristics are determined by the nature of the load being connected to the AC power supply. For an inductive load, the current lags the voltage by 90°. Therefore, the turn-on delay subsequent a positive-going zero-crossing is chosen to have turn-on when the voltage is at a positive peak and the current nearly zero. The turn-off delay is chosen to have turn-off when the voltage is at a negative peak and the current nearly zero. However, since most inductive loads have some resistive impedance, the current lag will be less than 90°; but for practical purposes this is important only for turn-off purposes. Therefore, where the load is inductive-resistive, the turn-off delay will be greater than for a purely inductive load because of the decreased phase lag. In theory, a purely inductive load would require a turn-off delay of one-half the time between zero-crossings; and a purely resistive load would require a turn-off delay of the full time between zero crossings. In practice, a turn-off delay somewhere between one-half and the full time duration between zero-crossings will be necessary. With regard to turn-on, a delay which would give zero current for a purely inductive load is reasonable for most loads having inductive elements.

From this detailed description of the preferred embodiment of the present invention, it will be apparent to those skilled in this particular art that various modifications can be made within the spirit and scope of the invention which is defined by the following claims.

What is claimed is:

1. A switching control circuit for timing the selective energization of a load by an AC power source in response to the actuation of an ON/OFF switch comprising:

means for generating pulses having transitions synchronous with the voltage zero-crossings of the AC power source;

timing means triggered by said pulse generating means for generating a first timed signal which begins on the occurrence of a positive-going voltage zero-crossing and a second timed signal which begins on the occurrence of a negative-going voltage zero-crossing;

output means responsive to said timing means and the actuation of the ON/OFF switch for generating turn-on and turn-off signals, said turn-on signal being generated after the first timing of said first timed signal subsequent the actuation of an ON condition and said turn-off signal being generated after the first timing out of said second timed signal subsequent the actuation of an OFF condition; and switching means for electrically coupling and uncoupling the load from the AC power source in response to said turn-on and turn-off signals, respectively.

2. The switching control circuit of claim 1 wherein said switching means comprises:

a transistor for accepting said turn-on and turn-off signals, said transistor being in a conductive state in the presence of a turn-on signal and being in a non-conductive state in the presence of a turn-off signal; and a relay activated and deactivated by said transistor.

3. The switching control circuit of claim 2 wherein said output means comprises:

a clocked two-state device for generating and maintaining said turn-on and turn-off signals, said signals changing from one to the other only on the application of a clock pulse to said clocked two-state device; and clocking means cooperating with said timing means and said clocked two-state device for generating clock pulses which are selectively applied to said two-state device upon the timing out of said first timed signal if said two-state device is generating a turn-off signal or which are applied to said two-state device upon the timing out of said second timed signal if said two-state device is generating a turn-on signal.

4. The switching control circuit of claim 3 wherein said timing means comprises:

a first one-shot device which is positively triggered by positive-going transitions of the pulses from said pulse generating means;

a second one-shot device which is positively triggered by pulses which are the inverse of the pulses from said pulse generating means; and means interposed between said pulse generating means and said second one-shot device for inverting the pulses from said pulse generating means.

5. The switching control circuit of claim 4 wherein said first one-shot has its negative input connected to ground and said second one-shot has said turn-on and turn-off signals applied to its negative input, said turn-off signal preventing said second one-shot from being positively triggered by said inverted pulses.

6. The switching circuit of claim 5 wherein said clocking means comprises:

a first dual input NAND gate for accepting said first timed signals as one input and said turn-on and turn-off signals as another input;

a second dual input NAND gate having a first input for accepting the output from said first dual input nand gate;

a first inverter coupled between said second one-shot and said first input of said second NAND gate for applying inverted second timed signals to said second NAND gate;

a second inverter having as its input the output of said first inverter;

an RC network coupling the output of said second inverter to the second input of said second NAND gate, said RC network comprising a resistor connected between the output of said second inverter and the second input of said second NAND gate and a capacitor connected between the second input of said second NAND gate and ground; and a third inverter for coupling the output of said second NAND gate to said clocked two-state device.

7. A switching control circuit for timing the selective energization of a load by an AC power source in response to the actuation of an ON/OFF switch comprising:

means for generating pulses having transitions synchronous with the voltage zero-crossings of the AC power source;

first timing means triggered by said pulse generating means for generating a first timed signal of predetermined duration on the occurrence of a positive-going voltage zero-crossing;

second timing means triggered by said pulse generating means for generating a second timed signal of predetermined duration on the occurrence of a negative-going voltage zero-crossing;

output means responsive to the actuation of the ON/OFF switch and said first and second timed signals for generating a turn-on signal and a turn-off signal, said turn-on signal being generated when said first timed signal times out subsequent the actuation of an ON condition and said turn-off signal being generated when said second timed signal times out subsequent the actuation of an OFF condition; and switching means for electrically coupling the load to the AC power source in response to said turn-on signal and for electrically uncoupling the load from the AC power source in response to said turn-off signal.

8. The switching control circuit of claim 7 wherein said switching means comprises:

a transistor for accepting said turn-on and turn-off signals, said transistor being in a conductive state when said turn-on signal is present and being in a non-conductive state when said turn-off signal is present; and a relay activated and deactivated by said transistor.

9. The switching control circuit of claim 8 wherein said output means comprises:

a clocked two-state device for generating and maintaining said turn-on and turn-off signals, said signals changing from one to the other only on the application of a clock pulse to said clocked two-state device; and clocking means cooperating with said timing means and said clocked two-state device for generating clock pulses which are selectively applied to said two-state device upon the timing out of said first timed signal if said two-state device is generating a turn-off signal or which are applied to said two-state device upon the timing out of said second timed signal if said two-state device is generating a turn-on signal.

10. The switching control circuit of claim 9 wherein said first timing means comprises a first one-shot device which is positively triggered by positive-going transitions of the pulses from said pulse generating means, said first one-shot having its negative input at a constant ground potential.

11. The switching control circuit of claim 10 wherein said second timing means comprises:

a second one-shot device which is positively triggered by positive-going input pulses which are the inverse of negative-going pulses generated by said pulse generating means, said second one-shot accepting at its negative input said turn-on and turn-off signals and capable of being triggered only when said turn-on signal is present; and means coupled between said pulse generating means and said second one-shot device for inverting the pulses from said pulse generating means.

12. The switching control circuit of claim 11 wherein said clocking means comprises:

a first dual input NAND gate for accepting said first timed signals as one input and said turn-on and turn-off signals as another input;

a second dual input NAND gate having a first input for accepting the output from said first dual input NAND gate;

a first inverter coupled between said second one-shot and said first input of said second NAND gate for applying inverted second timed signals to said second NAND gate;
a second inverter having as its input the output of said first inverter;
an RC network coupling the output of said second inverter to the second input of said second NAND gate, said RC network comprising a resistor connected between the output of said second inverter and the second input of said second NAND gate and a capacitor connected between the second input of said second NAND gate and ground; and
a third inverter for coupling the output of said second NAND gate to said clocked two-state device.

13. A switching control circuit for selectively timing the energization of a load by an AC power source in response to the actuation of an ON/OFF switch comprising:
means for generating pulses synchronous with the zero-crossings of the voltage of the AC power source, said pulses having positive-going leading edges synchronous with the positive-going zero-crossings and negative-going trailing edges synchronous with the negative-going zero-crossings;
first timing means triggered by said pulse generating means for generating a first timed signal in response to said leading edges;
second timing means triggered by said pulse generating means for generating a second timed signal in response to said trailing edges;
clocked latching means responsive to the actuation of the ON/OFF switch for generating turn-on and turn-off signals upon the application of clock pulses, said turn-on signal being generated on the application of a clock pulse subsequent the actuation of an ON condition and said turn-off signal being generated on the application of a clock pulse subsequent the actuation of an OFF condition, either of said turn-on and turn-off signals being maintained until the application of a clock pulse subsequent the actuation of a condition of the ON/OFF switch which would change the signal generated by said latching means;
clocking means cooperating with said first and second timing means and rsponsive to the signals generated by said latching means for applying clock pulses to said latching means, said clock pulses being applied after said first timed signal times out if said latching means is generating a turn-off signal or after said second timed signal times out if said latching means is generating a turn-on signal; and
switching means responsive to said turn-on and turn-off signals generated by said latching means for electrically coupling the load to the AC source in response to a turn-on signal and for uncoupling the load from the AC source in response to a turn-off signal.

14. The switching circuit of claim 13 wherein said switching means comprises:
a transistor for accepting said turn-on and turn-off signals, said transistor being in a conductive state in the presence of a turn-on signal and being in a non-conductive state in the presence of a turn-off signal; and
a relay activated and deactivated by said transistor.

15. The switching circuit of claim 14 wherein said first timing means comprises a first one-shot device which is positively triggered by positive-going input pulses which are received directly from said synchronous pulse generating means.

16. The switching circuit of claim 15 wherein said second timing means comprises:
a second one-shot device which is positively triggered by positive-going input pulses which are the inverse of negative-going pulse generated by said synchronous pulse generating means, said second one-shot accepting of its negative input said turn-on and turn-off signals and capable of being triggered only when said turn-on signal is present; and
inverting means coupled between said pulse generating means and said second one-shot for inverting the pulses generated by said pulse generating means.

17. The switching control circuit of claim 16 wherein said clocking means comprises:
a first dual input NAND gate for accepting said first timed output as one input and said turn-on and turn-off signals as another input;
a second dual input NAND gate having a first input for accepting the output from said first dual input NAND gate;
a first inverter coupled between said second one-shot and said first input of said second NAND gate for applying inverted second timed signals to said second NAND gate;
a second inverter having as its input the output of said first inverter;
an RC network coupling the output of said second inverter to the second input of said second NAND gate, said RC network comprising a resistor connected between the output of said second inverter and the second input of said second NAND gate and a capacitor connected between the second input of said second NAND gate and ground; and
a third inverter for coupling the output of said second NAND gate to said clocked two-state device.

* * * * *